United States Patent [19]
Poschenrieder et al.

[11] Patent Number: 5,815,247
[45] Date of Patent: Sep. 29, 1998

[54] AVOIDANCE OF PATTERN SHORTENING BY USING OFF AXIS ILLUMINATION WITH DIPOLE AND POLARIZING APERTURES

[75] Inventors: Bernhard Poschenrieder, Poughkeepsie; Takashi Sato, Fishkill; Tsukasa Azuma, Poughkeepsie, all of N.Y.

[73] Assignees: Siemens Aktiengesellschaft, Munich, Germany; Kabushiki Kaisha Toshiba, Kanagawa-Ken, Japan

[21] Appl. No.: 531,767

[22] Filed: Sep. 21, 1995

[51] Int. Cl.$^6$ .......................... G03B 27/42; G03B 27/54; G03B 27/72
[52] U.S. Cl. .................. 355/71; 355/53; 355/67
[58] Field of Search .................. 355/53, 55, 67, 355/71

[56] References Cited

U.S. PATENT DOCUMENTS

| | | | |
|---|---|---|---|
| 5,144,362 | 9/1992 | Kamon et al. | 355/53 |
| 5,305,054 | 4/1994 | Suzuki et al. | 355/53 |
| 5,392,094 | 2/1995 | Kudo | 355/67 |
| 5,530,518 | 6/1996 | Ushida et al. | 355/53 |
| 5,659,429 | 8/1997 | Kudo | 355/67 |
| 5,661,546 | 8/1997 | Taniguchi | 355/53 |
| 5,661,601 | 8/1997 | Kang et al. | 359/562 |

*Primary Examiner*—R. L. Moses
*Assistant Examiner*—Shival Virmani
*Attorney, Agent, or Firm*—Donald B. Paschburg

[57] ABSTRACT

A system and method of avoiding pattern shortening without resorting to generating a mask with a bias solve the direction dependent differences in exposure behavior in photolithography processes in the manufacture of semiconductor devices. Instead of designing a biased mask to solve the exposure problem, the pattern shortening effect is avoided by influencing the exposure process itself. By using an off axis illumination technique, the exposure is separated into different directions. In one embodiment, off axis illumination is applied in combination with special dipole apertures (i.e., two openings). The exposure is done in two or more parts, whereby the aperture is twisted between exposures. In another embodiment, off axis illumination is used in combination with special polarizer apertures. As with the first embodiment, the exposure is done in two or more parts, but in this case with differently polarized light.

9 Claims, 3 Drawing Sheets

AVOIDANCE OF PATTERN SHORTENING BY USING OFF AXIS ILLUMINATION WITH DIPOLE AND POLARIZING APERTURES

BACKGROUND OF THE INVENTION

1. Field of the Invention

The present invention generally relates to the manufacture of very large scale integrated (VLSI) circuit devices and, more particularly, to the fidelity enhancement of lithographic images through the use of off axis illumination with optical twisting dipole and polarizing apertures.

2. Background Description

Manufacturing of semiconductor devices is dependent upon the accurate replication of computer aided design (CAD) generated patterns onto the surface of a device substrate. The replication process is typically performed using optical lithography followed by a variety of subtractive (etch) and additive (deposition) processes. Optical lithography patterning involves the illumination of a metallic (e.g., chrome) coated quartz plate known as a photomask which contains a magnified image of the computer generated pattern etched into the metallic layer. This illuminated image is reduced in size and patterned into a photosensitive film on the device substrate. As a result of the interference and processing effects which occur during pattern transfer, images formed on the device substrate deviate from their ideal dimensions and shape as represented by the computer images. These deviations depend on the characteristics of the patterns as well as a variety of process conditions. Because these deviations can significantly effect the performance of the semiconductor device, many approaches have been pursued which focus on CAD compensation schemes which ensure a resultant ideal image.

The performance enhancement of advanced VLSI circuitry (that is, the speed enhancement versus dimension reduction of the circuits) is increasingly limited by the lack of pattern fidelity in a series of lithography and reactive ion etch (RIE) processes at small dimensions (e.g., sub 0.5 $\mu$m). In the photolithography process, a pattern is transferred from a photomask to a photosensitive film (resist) on the wafer. In the RIE process, this pattern in the resist is transferred into a variety of films on the wafer substrate. After lithography, some structures show a so-called pattern shortening effect. This effect is due to the fact that the exposure process is direction dependent. This means that the exposure dose (i.e., exposure time) then has to be optimized for one direction. The other direction cannot be independently optimized. The unfortunate consequence is the above described pattern or line shortening.

An alternative to the costly development of processes with every higher effective resolution is the selective biasing of mask patterns to compensate for the pattern distortions occurring during wafer processing. The term Optical Proximity Correction (OPC) is commonly used to describe this process of selective mask biasing, even though the trend exists to include pattern distortions unrelated to the optical image transfer. The idea of biasing patterns to compensate for image transfer infidelities has been commonly applied to E-beam lithography to counteract the effects of back scattered electrons, both in the writing of photo masks and in direct wafer writing operations. See for example U.S. Pat. No. 5,278,421.

OPC extends the use of the automatic pattern biasing concept to the two major pattern transfer processes used in VLSI technologies. Current implementations of OPC can be categorized as "rules-based" in which patterns are sorted and biased in the computer aided design (CAD) data set based on rules relating bias amounts to pattern attributes such as size, proximity, and density, and "convolution-based" in which CAD patterns are biased based on particular pattern environment. Both the rules and convolution functions can be generated either from process simulations or empirical data. For examples of "rules-based" OPC implementations, see Richard C. Henderson and Oberdan W. Otto, "CD data requirements for proximity effect corrections", 14*th Annual BACUS Symposium on Photomask Technology and Management*, William L. Brodsky and Gilbert V. Shelden, Editors, Proc. SPIE 2322 (1994), pp. 218–228, and Oberdan W. Otto, Joseph G. Garofalo, K. K. Low, Chi-Min Yuan, Richard C. Henderson, Christophe Pierrat, Robert L. Kostelak, Shiela Vaidya, and P. K. Vasudev, "Automated optical proximity correction—a rules-based approach", *Optical/Laser Microlithography VII*, Timothy A. Brunner, Editor, Proc. SPIE 2197 (1994), pp. 278–293. For examples of the "convolution-based" OPC implementations, see John P. Stirniman and Michael L. Rieger, "Fast proximity correlation with zone sampling", *Optical/Laser Microlithography VII*, Timothy A. Brunner, Editor, Proc. SPIE 2197 (1994), pp. 294–301, and John Stirniman and Michael Rieger, "Optimizing proximity correction for wafer fabrication processes", 14*th Annual BACUS Symposium on Photomask Technology and Management*, William L. Brodsky and Gilbert V. Shelden, Editors, Proc. SPIE 2322 (1994), pp. 239–246. In order to compensate the direction dependent differences in exposure behavior, the associated masks are designed with a certain bias. This bias is such that, for example, the lines are designed slightly longer. There are, however, limitations to this solution due to the limited resolution of the chrome mask writing system being used.

SUMMARY OF THE INVENTION

It is therefore an object of the present invention to provide a system and method of avoiding pattern shortening without resorting to generating a mask with a bias to solve the direction dependent differences in exposure behavior in photolithography processes.

According to the invention, instead of designing a biased mask to solve the exposure problem, the pattern shortening effect is avoided by influencing the exposure process itself. Currently, all directions are exposed to the light for the same time (i.e., the total exposure time). By using an off axis illumination technique, it is possible to separate the exposure in different directions. More specifically, the problem of pattern shortening is solved according to one embodiment of the invention by applying the off axis illumination technique in combination with special dipole apertures (i.e., two openings). The exposure is done in two or more parts, whereby the aperture is twisted by, say, 90° between two exposures. According to another embodiment of the invention, the off axis illumination technique is used in combination with special polarizer apertures. As with the first embodiment, the exposure is done in two or more parts, but in this case with differently polarized light.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
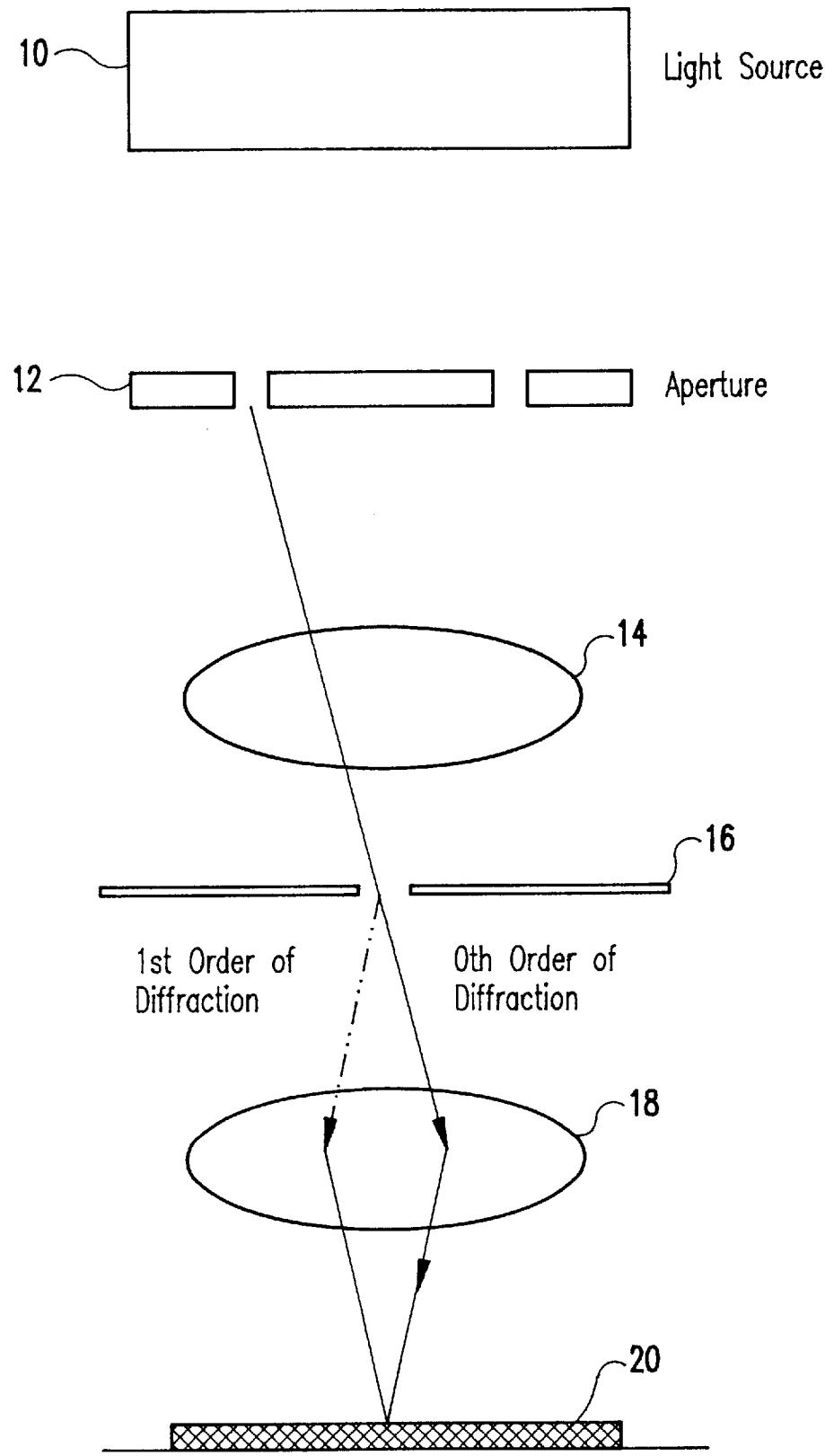
FIG. 1 is a diagram showing the arrangement of an off axis illumination photolithography system as used in the practice of the invention according to a first embodiment.

Referring now to the drawings, and more particularly to FIG. 1, there is shown a schematic diagram of an off axis illumination photolithography system. A light source 10 illuminates an aperture plate 12. Light passing through the aperture plate 12 is focused by lens system 14 onto a mask 16 having small dimensions relative to the wavelength of the illuminating light such as to produce a diffraction pattern. The mask 16 is typically an etched chrome pattern on quartz. The $0^{th}$ and $1^{st}$ order diffraction components of the light passed by the mask 16 is, in turn, focused by lens system 18 onto a target 20, such as a substrate coated with a photosensitive film.

Figure 2A:
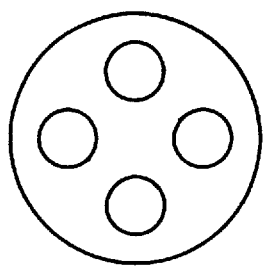
FIGS. 2A and 2B are plan views of standard apertures used in conventional off axis illumination photolithography systems.
Figure 2B:
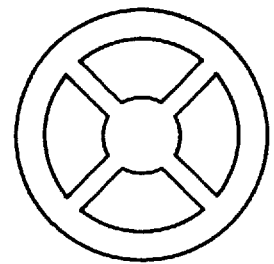

The aperture plate 12 in a conventional off axis illumination photolithographic system typically takes the form of the aperture plates shown in FIGS. 2A and 2B. The aperture plate in FIG. 2A is characterized by four off-center circular apertures located 90° apart about the center of the aperture plate. The aperture plate in FIG. 2B is characterized by four pie-shaped holes with the center section occluded. Using either of these aperture plates in an off-axis illumination photolithographic system such as shown in FIG. 1 limits the control of the illumination. That is, the exposure process is direction dependent, and it is only possible to optimize the exposure dose (i.e., exposure time) for only one direction.

Figure 3A:
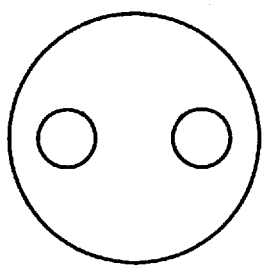
FIGS. 3A and 3B are plan views of twisting dipole apertures used in the off axis illumination photolithography system of FIG. 1 according to a first embodiment of the invention.
Figure 3B:
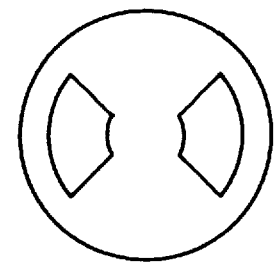

According to the invention, the exposure process is separated into two directions, allowing for optimization of the exposure dose in each of the two directions. In the first embodiment of the invention, aperture plates as shown in FIGS. 3A and 3B are used. These plates are characterized by having apertures only along one axis (i.e., diameter), the apertures along the perpendicular axis as shown in FIGS. 2A and 2B, respectively, being eliminated. The aperture plates shown in FIGS. 3A and 3B are referred to herein as a dipole aperture plate. By using these dipole aperture plates, it is now possible to expose one direction for a different time than another. For example, one direction could be exposed for 40% and the perpendicular direction for 60% of the total exposure time. These different exposure directions can be separated by twisting the dipole aperture plate by 90° between each of the two exposure doses.

It is also possible to separate the exposure dose into more than two directions. This can be done, for example, by twisting the aperture dipole less than 90° between each dose. In addition, the aperture dipole plate can be rotated with a nonconstant angular velocity tailored to the desired dose compensation.

Figure 5A:
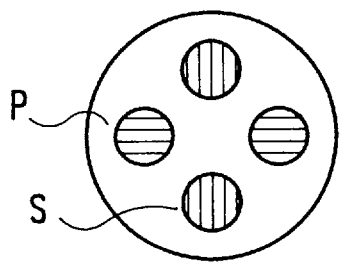
FIGS. 5A and 5B are plan views of polarizing apertures used in the off axis illumination photolithography system of FIG. 1 according to a second embodiment of the invention.
Figure 5B:
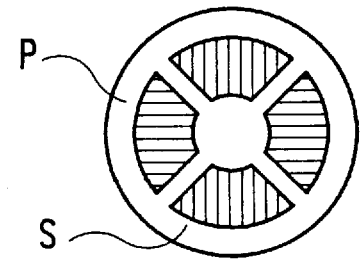
Figure 4:
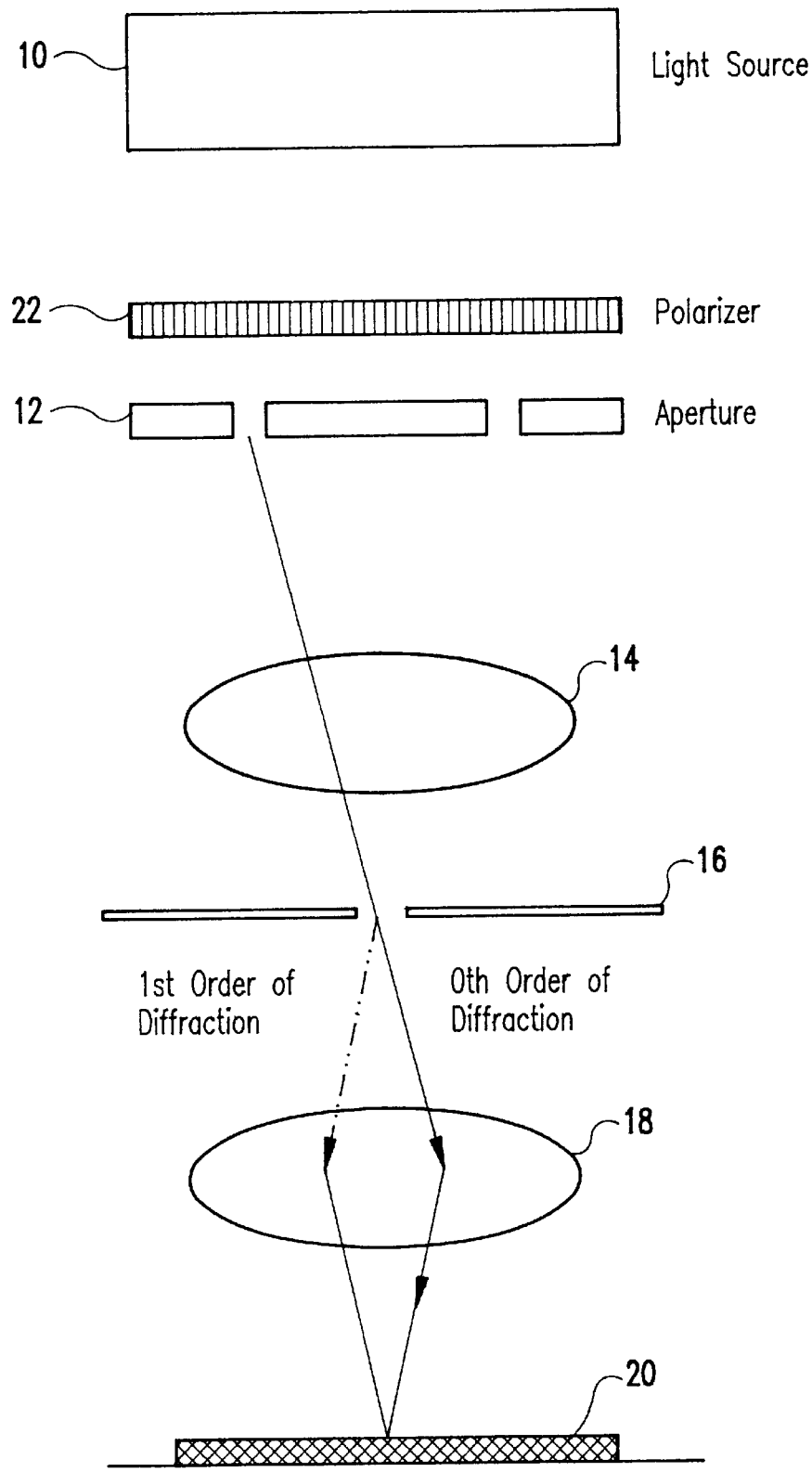
FIG. 4 is a schematic diagram showing the arrangement of an off axis illumination photolithography system as used in the practice of the invention according to a second embodiment.

According to a second embodiment of the invention, similar dose compensation can be accomplished using polarizers, as generally shown in FIGS. 4 and 5A and 5B. In FIG. 4, the structure shown is generally the same as that shown in FIG. 1 and like reference numerals designate the same or similar elements. A polarizer 22 is added between the light source 10 and the aperture plate 12. The aperture plate 12 takes the form of one of the aperture plates shown in FIGS. 5A or 5B. These aperture plates are similar to the aperture plates shown in FIGS. 2A and 2B except that the apertures are filled with polarizing films. The polarizations of the films in the apertures on one axis are perpendicular to the polarizations of the films in the apertures on the perpendicular axis.

Using the arrangement shown in FIGS. 4 and 5A or 5B, it is again possible to expose one direction for a different time than another. These different exposure directions are separate by applying the two exposure steps with two differently polarized lights. As in the first embodiment, it is also possible to separate the exposure into more than two directions using similar techniques.

While the invention has been described in terms of two preferred embodiments, those skilled in the art will recognize that the invention can be practiced with modification within the spirit and scope of the appended claims.

Having thus described our invention, what we claim as new and desire to secure by letters patent is as follows:

1. An off axis illumination system for photolithographic exposure of a photosensitive film on a device substrate in the manufacture of semiconductor devices comprising:

a source of light for exposing the photosensitive film;

a photomask which contains a magnified image of pattern etched into a metallic layer, said photomask being interposed between the source of light and the photosensitive film to be exposed;

a lens system between the photomask and the resist for reducing the size of an illuminated image for patterning into the photosensitive film on the device substrate; and an aperture plate positioned between the source of light and the photomask, said aperture plate allowing the off axis exposure of the photosensitive film to be separated into two or more exposures, each of said two or more exposures being separately time optimized to avoid pattern shortening in a projected image of the photomask on the photosensitive film.

2. An off axis illumination system for photolithographic exposure of a photosensitive film on a device substrate in the manufacture of semiconductor devices comprising:

a source of light for exposing the photosensitive film;

a photomask which contains a magnified image of pattern etched into a metallic layer, said photomask being interposed between the source of light and the photosensitive film to be exposed;

a lens system between the photomask and the resist for reducing the size of an illuminated image for patterning into the photosensitive film on the device substrate; and an aperture plate positioned between the source of light and the photomask, said aperture plate allowing the off axis exposure of the photosensitive film to be separated into two or more exposures, each of said two or more exposures being separately time optimized to avoid pattern shortening in a projected image of the photomask on the photosensitive film;

wherein said aperture plate is a dipole aperture plate having two off center apertures on a common said aperture plate being rotated between exposure doses to separate the exposure of the photosensitive film into two or more exposures.

3. The off axis illumination system for photolithographic exposure of a photosensitive film on a device substrate in the manufacture of semiconductor devices as recited in claim 2 wherein said aperture plate is characterized by two circular off center apertures.

4. The off axis illumination system for photolithographic exposure of a photosensitive film on a device substrate in the manufacture of semiconductor devices as recited in claim 2 wherein said aperture plate is characterized by two generally pie shaped off center apertures.

5. An off axis illumination system for photolithographic exposure of a photosensitive film on a device substrate in the manufacture of semiconductor devices comprising:

a source of light for exposing the photosensitive film;

a photomask which contains a magnified image of pattern etched into a metallic layer, said photomask being interposed between the source of light and the photosensitive film to be exposed;

a lens system between the photomask and the resist for reducing the size of an illuminated image for patterning into the photosensitive film on the device substrate;

an aperture plate positioned between the source of light and the photomask, said aperture plate allowing the off axis exposure of the photosensitive film to be separated into two or more exposures, each of said two or more exposures being separately time optimized to avoid pattern shortening in a projected image of the photomask on the photosensitive film; and a polarizer interposed between said source of light and said aperture plate, said aperture plate having apertures filled with polarizing film, said aperture plate being rotated between exposure doses to separate the exposure of the photosensitive film into two or more exposures.

6. The off axis illumination system for photolithographic exposure of a photosensitive film on a device substrate in the manufacture of semiconductor devices as recited in claim 5 wherein said aperture plate is characterized by off center apertures on two mutually perpendicular axes, polarizations of films of said apertures on said two axes being mutually perpendicular.

7. A method of avoiding pattern shortening in an off axis illumination system for photolithographic exposure of a photosensitive film on a device substrate in the manufacture of semiconductor devices comprising the steps of:

providing a source of light for exposing the photosensitive film;

interposing a photomask which contains a magnified image of pattern etched into a metallic layer between the source of light and the photosensitive film to be exposed;

reducing the size of an illuminated image for patterning into the photosensitive film on the device substrate;

positioning an aperture plate between the source of light and the photomask; and separating the off axis exposure of the photosensitive film into two or more exposures by rotating the aperture plate between exposures, each exposure being separately optimized to avoid pattern shortening in a projected image of the photomask on the photosensitive film.

8. A method of avoiding pattern shortening in an off axis illumination system for photolithographic exposure of a photosensitive film on a device substrate in the manufacture of semiconductor devices comprising the steps of:

providing a source of light for exposing the photosensitive film;

interposing a photomask which contains a magnified image of pattern etched into a metallic layer between the source of light and the photosensitive film to be exposed;

reducing the size of an illuminated image for patterning into the photosensitive film on the device substrate:

positioning an aperture plate between the source of light and the photomask; and separating the off axis exposure of the photosensitive film into two or more exposures by rotating the aperture plate between exposures, each exposure being separately optimized to avoid pattern shortening in a projected image of the photomask on the photosensitive film, wherein the aperture plate is a dipole aperture plate having two off center apertures on a common axis, said aperture plate being rotated between exposure doses to separate the exposure of the photosensitive film into two or more exposures.

9. A method of avoiding pattern shortening in an off axis illumination system for photolithographic exposure of a photosensitive film on a device substrate in the manufacture of semiconductor devices comprising the steps of:

providing a source of light for exposing the photosensitive film;

interposing a photomask which contains a magnified image of pattern etched into a metallic layer between the source of light and the photosensitive film to be exposed;

reducing the size of an illuminated image for patterning into the photosensitive film on the device substrate;

positioning an aperture plate between the source of light and the photomask;

separating the off axis exposure of the photosensitive film into two or more exposures by rotating the aperture plate between exposures, each exposure being separately optimized to avoid pattern shortening in a projected image of the photomask on the photosensitive film; and interposing a polarizer between said source of light and said aperture plate, said aperture plate having apertures filled with polarizing film, said aperture plate being rotated between exposure doses to separate the exposure of the photosensitive film into two or more exposures.

* * * * *